United States Patent

Braat

Patent Number: 6,081,578
Date of Patent: Jun. 27, 2000

[54] THREE-MIRROR SYSTEM FOR LITHOGRAPHIC PROJECTION, AND PROJECTION APPARATUS COMPRISING SUCH A MIRROR SYSTEM

[75] Inventor: Josephus J. M. Braat, Eindhoven, Netherlands

[73] Assignee: U.S. Philips Corporation, New York, N.Y.

[21] Appl. No.: 09/098,888

[22] Filed: Jun. 17, 1998

[30] Foreign Application Priority Data

Nov. 7, 1997 [EP] European Pat. Off. ............. 97203442

[51] Int. Cl.⁷ .................................................. G21K 5/00
[52] U.S. Cl. ................................. 378/34; 378/84; 378/85
[58] Field of Search ................................. 378/34, 84, 85; 359/859

[56] References Cited

U.S. PATENT DOCUMENTS

| | | | |
|---|---|---|---|
| 4,265,510 | 5/1981 | Cook | 359/366 |
| 4,747,678 | 5/1988 | Shafer et al. | 359/366 |
| 5,003,567 | 3/1991 | Hawryluk et al. | 378/34 |
| 5,063,586 | 11/1991 | Jewell et al. | 378/34 |
| 5,144,363 | 9/1992 | Wittekoek et al. | 355/53 |
| 5,153,898 | 10/1992 | Suzuki et al. | 378/34 |
| 5,191,200 | 3/1993 | Van Der Werf et al. | 250/201.4 |
| 5,212,588 | 5/1993 | Viswanathan et al. | 359/355 |
| 5,220,590 | 6/1993 | Bruning et al. | 378/34 |
| 5,315,629 | 5/1994 | Jewell et al. | 378/34 |
| 5,353,322 | 10/1994 | Bruning et al. | 378/34 |
| 5,805,365 | 9/1998 | Sweatt | 359/858 |
| 5,815,310 | 9/1998 | Williamson | 359/365 |
| 5,956,192 | 9/1999 | Williamson | 359/859 |
| 5,973,826 | 10/1999 | Chapman et al. | 359/355 |
| 6,014,252 | 1/2000 | Shafer | 359/355 |

FOREIGN PATENT DOCUMENTS

WO9733204  9/1997  WIPO ............... G03F 7/20

*Primary Examiner*—David P. Porta
*Assistant Examiner*—Allen C. Ho
*Attorney, Agent, or Firm*—Steven R. Biren

[57] ABSTRACT

A projection system is described for projecting a mask pattern on a substrate by means of EUV radiation, which projection system consecutively comprises a first concave mirror (1), a convex mirror (2) and a second concave mirror (3). Since the system has a focal length f which is at least equal to +½ L, in which L is the length of the system, and the chief ray of the object beam ($b_2$) leaving the object plane (V) is inclined towards the optical axis (OO'), a compact system is obtained whose first concave mirror (1) has relatively moderate dimensions and in which the axial positions of the concave mirrors (1, 3) are approximately equal, so that these mirrors can be arranged on a common support.

7 Claims, 3 Drawing Sheets

THREE-MIRROR SYSTEM FOR LITHOGRAPHIC PROJECTION, AND PROJECTION APPARATUS COMPRISING SUCH A MIRROR SYSTEM

BACKGROUND OF THE INVENTION

The invention relates to a projection system for a step-and-scan lithographic projection apparatus, comprising a source of EUV radiation, in which a mask pattern, present in a mask, is imaged on a substrate provided with a layer which is sensitive to EUV radiation, said projection system having a magnification M of ¼ and a numerical aperture NA of 0.1, and comprising consecutively, from the mask side to the substrate side, a first concave mirror, a convex mirror and a second concave mirror.

The invention also relates to a step-and-scan lithographic projection apparatus comprising such a projection system.

A projection system of this type is known from U.S. Pat. No. 5,353,322 which is a continuation of U.S. Pat. No. 5,220,590. Both patents relate to projection systems with three curved mirrors for use in a lithographic projection apparatus in which extreme ultraviolet radiation, hereinafter referred to as EUV radiation, is used for imaging a mask pattern on a substrate. The EUV radiation, which is also referred to as soft X-ray radiation and has a wavelength in the range between 2 and 20 nm, has the great advantage that extremely small details, of the order of 0.1 μm or less, can be satisfactorily imaged with this radiation. In other words, an imaging system in which EUV radiation is used has a very high resolving power without the numerical aperture (NA) of the system having to be extremely large, so that also the depth of focus of the system still has a reasonably large value.

The three-mirror systems described in U.S. Pat. No. 5,220,590 have such designs that the following conditions are met:

the mirror systems should have a sufficiently large free working distance, of the order of 10 to 112 mm, so that there is sufficient space for moving the substrate holder and the mask holder;

the aim should be to render the so-called Petzval sum equal to zero, and the numerical aperture should be at least 0.05.

The parameters which are used in U.S. Pat. No. 5,220,590 for characterizing the possible embodiments are the magnifications $m_1$, $m_2$ and $m_3$ of the first concave mirror, the convex mirror and the second concave mirror, respectively, and these embodiments are shown by way of points in an X–Y system of co-ordinates in which the magnification $m_2$ is plotted on the X axis and the ratio $m_1/m_3$ is plotted on the Y axis. All embodiments are intended for full-field illumination, i.e. all areas of the mask pattern are illuminated simultaneously and these areas are imaged simultaneously on an IC area of the substrate. Such an illumination is used in the lithographic projection apparatuses which are known as steppers. After a first IC area of the substrate has been illuminated in such an apparatus, the substrate holder is moved in such a way that a subsequent IC area is positioned under the mask pattern and the projection system, whereafter this area is illuminated, and so forth, until all IC areas of the substrate are illuminated with the mask pattern.

It is attempted to meet the need for ICs with a larger number of components by not only reducing the dimensions of these components but also increasing the surface of the ICs. This means that the image field of the projection system must be increased. In lithographic apparatuses in which so-called deep-UV radiation at a wavelength of, for example, 248 nm, and a projection lens system having a high NA, for example, 0.5 are used, the practically unsolvable problem of the simultaneous increase of the NA and the image field has been circumvented by changing from a stepping apparatus to a step-and-scan apparatus. In such an apparatus, a rectangular or circular segment of the mask pattern and hence also of an IC area on the substrate is illuminated each time, and the mask pattern and the substrate are moved synchronously through the illumination beam, taking the magnification of the projection system into account. A different circular segment of the mask pattern is then imaged each time on a corresponding segment of the relevant IC area. After the entire mask pattern has been imaged on an IC area in this way, the substrate holder performs a stepping movement, i.e. the beginning of a subsequent IC area is introduced into the projection beam and the mask is set to its initial position, whereafter the subsequent IC area is scan-illuminated via the mask pattern. This scan-imaging method may also be used to great advantage in a lithographic projection apparatus in which EUV radiation is used as projection radiation.

All projection systems described in U.S. Pat. No. 5,220,590 are intended for stepping apparatuses; no embodiment of a step-and-scan apparatus is described. Such an embodiment is, however, described in U.S. Pat. No. 5,353,322, namely as "lens system 80" and illustrated in FIG. 6. This three-mirror system, with three aspherical surfaces, has a sufficiently large NA of 0.1, a sufficiently small distance between the extreme mirrors, and has the advantage that the mask and the substrate are situated at the same side of the system. Since a circular segment illumination is used, a physical diaphragm can be arranged in the system. However, in accordance with U.S. Pat. No. 5,353,322, the chief ray of the object beam incident on the first concave mirror must then diverge at an angle of 7° to the optical axis of the system, and the system must have a relatively large power, which is the inverse of the total focal length of the system. This focal length is equal to −620 mm, which corresponds approximately to −½ L, in which L is the length of the system. Due to the diverging direction of incidence, the first concave mirror must have a very large diameter and this mirror must have a very large asphericity. Asphericity of a surface is understood to mean the largest deviation of this surface with respect to the spherical surface which best fits the aspherical surface. In the system 80 described in U.S. Pat. No. 5,353,322, the first concave mirror, the convex mirror and the second concave mirror have asphericities of 420 μm, 55 μm and 12 μm, respectively, if the asphericity is measured throughout the surface. Due to the large first mirror, with its large asphericity, the three-mirror system is difficult to manufacture for scanning projection in accordance with U.S. Pat. No. 5,353,322.

SUMMARY OF THE INVENTION

It is an object of the invention to provide a three-mirror projection system of the type described in the opening paragraph which can be manufactured in a relatively simple manner. This projection system is characterized in that the system has a focal length of at least +½ L, in which L is the total length of the system, and the chief ray of the object beam incident on the first concave mirror is inclined towards the optical axis of the system.

The invention is based on the recognition that, by choosing a larger and positive focal length, and hence a smaller total power of the projection system, the chief ray of the beam incident on the first concave mirror is inclined to a slight extent towards the optical axis of the system and is no longer remote to a larger extent from this optical axis, as in the embodiment 80 described in U.S. Pat. No. 5,353,322. Consequently, the first concave mirror can have a considerably smaller diameter and asphericity, while a physical diaphragm can still be arranged in the system.

If the embodiments of the mirror system according to the invention are described in terms of U.S. Pat. No. 5,353,322, then the points represented by these embodiments in FIG. 3 are relatively close to, and under the m axis and to the right of the area 50 of designs suitable in accordance with U.S. Pat. No. 5,353,322.

It is to be noted that U.S. Pat. No. 5,153,898 describes three-mirror systems for use in a lithographic projection apparatus. However, these mirror systems have a very small NA of 0.05 or less and all of them are intended for full-field illumination, i.e. not for use in scanning apparatuses. It is true that a general remark is made in U.S. Pat. No. 5,153,898 that the mirror systems can be rendered suitable for a scanning apparatus, but a design of a mirror system suitable for this application is not given. The axial distance between the mutually furthest remote elements, for example the mask and the first concave mirror, of the systems is very large, of the order of more than one to several meters. Moreover, in practice, a fourth, deflection, mirror will always be necessary to achieve that the substrate holder can perform the desired movements. U.S. Pat. No. 5,353,322 describes the projection systems of U.S. Pat. No. 5,153,898 which systems are denoted by $PA_1$–$PA_4$ in FIG. 3. These points are situated in a completely different area than the points associated with the embodiments of the mirror systems of the present invention.

This mirror system is preferably further characterized in that the first and the second concave mirror are situated at approximately equal axial positions.

From the point of view of tolerances and assembly, this is very advantageous because then, for example, these mirrors can be mounted on a support, with a mutual stability.

A first embodiment of the mirror system is further characterized in that the axial distance between the object plane of the system and the center of this system is larger than the axial distance between the convex mirror and the center of the system.

In this embodiment, the mask which is situated in the object plane, can move in its own plane through large distances and under the convex mirror without interrupting the imaging beam. Moreover, this system has a relatively small total length.

A second embodiment of the mirror system is further characterized in that, in the object plane, the distance between the point where the chief ray of the object beam leaves this plane and the convex mirror is at least equal to the dimension of the mask in the direction of this distance.

In this system, the movement of the mask which is necessary for projecting the entire mask pattern can be performed without interrupting the imaging beam.

The invention also relates to a step-and-scan lithographic projection apparatus comprising a source for EUV radiation, a mask holder for accommodating a mask, a substrate holder for accommodating a substrate, and a three-mirror projection system for imaging the mask pattern on the substrate. This apparatus is characterized in that the projection system is implemented as described above, and the chief ray of the beam emitted by the source and incident on the mask is inclined towards the optical axis of the projection system.

A first embodiment of this apparatus is further characterized in that the axial distance between the upper plane of the substrate holder and the convex lens is at least equal to the dimension of the mask table plus holder in the axial direction.

In this embodiment, the mask table can be arranged between the substrate and the convex lens so that a compact structure of the apparatus is possible.

A second embodiment of the apparatus is further characterized in that, in the plane of the mask, the distance between the convex mirror and the point where the chief ray of the beam emitted by the source is incident on the mask is at least equal to the dimension of the mask in the direction of this distance.

Then there is also sufficient space for the necessary movement of the mask, while there is also space between the mirror system and the substrate surface for providing sensors for various measurements.

These and other aspects of the invention will be apparent from and elucidated with reference to the embodiments described hereinafter.

DESCRIPTION OF THE PREFERRED EMBODIMENTS

Figure 1:
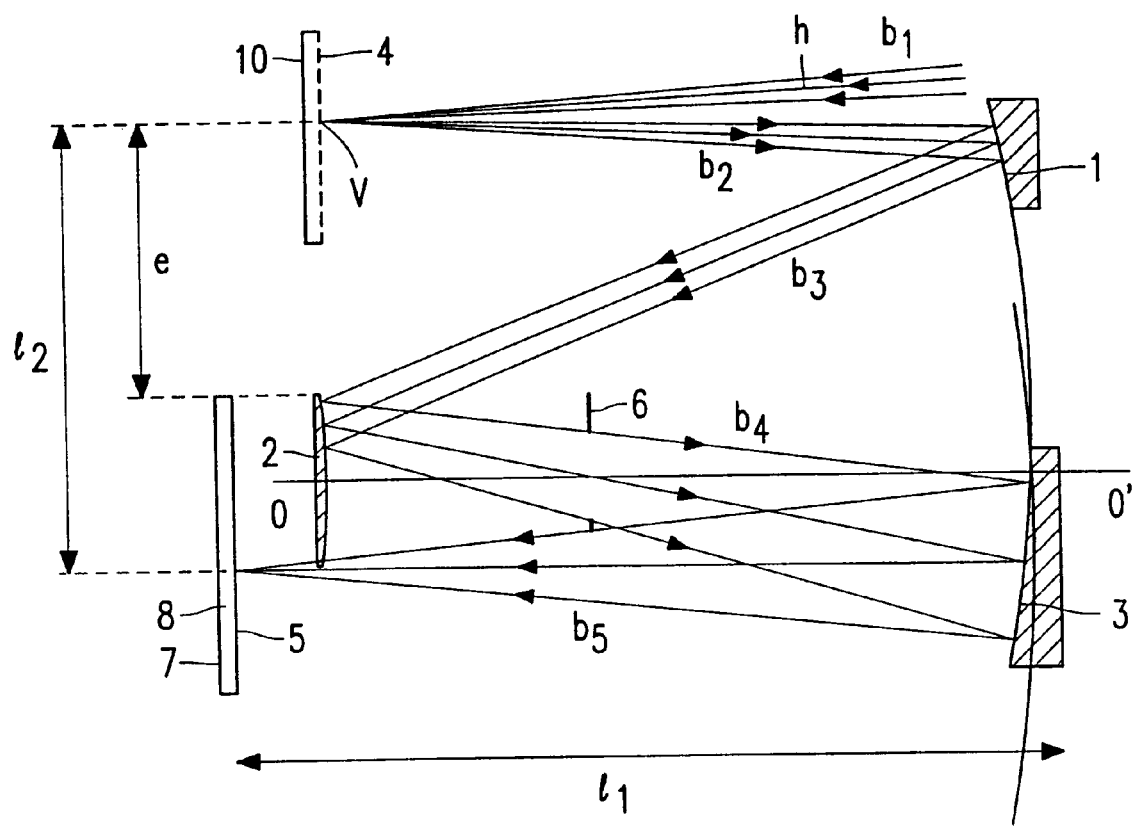
FIG. 1 shows a first embodiment of the mirror projection system.

In these Figures, corresponding elements have identical reference numerals.

In FIG. 1, the first concave mirror is denoted by the reference numeral 1, the convex mirror is denoted by the reference numeral 2 and the second concave mirror is denoted by the reference numeral 3. The object plane of the mirror system is denoted by the reference numeral 4. When the system is used, a mask 10 is arranged in this plane. The optical axis of the system is denoted by OO'.

An illumination beam $b_1$ emitted by a source (not shown), which beam has a cross-section in the shape of a circular segment, is incident on the object plane at a small angle of at most several degrees, at which the chief ray h of this beam is inclined towards the optical axis. A reflecting mask arranged in the object plane reflects this beam as an object beam $b_2$ to the first concave mirror 1. This mirror reflects the beam as a substantially parallel beam $b_3$ to the convex mirror 2 which sends the beam as a diverging beam $b_4$ to the second concave mirror 3. Finally, the mirror 3 focuses the beam as an object beam $b_5$ in the image plane 5 where a substrate 7 provided with a radiation-sensitive layer 8 is situated during use.

The system is designed in such a way that, in spite of, for example, the beams $b_4$ and $b_5$ extending close to each other, there is room for a diaphragm 6 in the beam $b_4$ where the chief ray of this beam intersects the optical axis OO'. As is known, such a diaphragm prevents scattered radiation or radiation caused by unwanted reflections from reaching the object beam $b_5$ so that the contrast of the image formed in the plane 5 decreases. All mirror surfaces are aspherical so that the system is well-corrected for aberrations and free from distortions to a great extent.

Thanks to the chosen direction of the illumination beam $b_1$, which direction also influences the path travelled by the imaging beam through the system, and determines the optical power, i.e. the inverse of the total focal length of the system, the dimension of the first concave mirror can remain limited. The asphericity which this mirror must have may thereby be limited. Furthermore, the two concave mirrors 1 and 3 can consequently be arranged at substantially the same axial positions, i.e. the positions as projected on the optical axis OO'. With a view to tolerances and assembly, this is very advantageous. The mirrors may be arranged on, for example, a common support so that they are satisfactorily fixed with respect to each other.

Instead of a reflecting mask, also a transmitting mask can be used. The radiation source should then be arranged at the left of the object plane 4. However, a reflecting mask for EUV radiation is easier to manufacture than a transmitting mask for such radiation.

The following Table shows the values of the relevant parameters of an embodiment of a mirror system as shown in FIG. 1. These parameters are:

the axial distances:
  $d_1$ between the object plane and the concave mirror 1;
  $d_2$ between the mirror 1 and the convex mirror 2;
  $d_3$ between the mirror 2 and the pupil (diaphragm) 6;
  $d_4$ between the pupil 6 and the concave mirror 3, and
  $d_5$ between the mirror 3 and the image plane 5,
the radii of curvature:
  $R_1$ of the mirror 1;
  $R_2$ of the mirror 2, and
  $R_3$ of the mirror 3,
the even terms $a_2$, $a_4$, $a_6$ and $a_8$ of the known series development:

$$Z = \sum_{i=1}^{4} a_{2i} r^{2i}$$

which describes the variation of an aspherical surface.

TABLE 1

| |
|---|
| $d_1$ = 453,2790 mm. |
| $d_2$ = −424,3820 |
| $d_3$ = 156,5990 |
| $d_4$ = 266,5590 |
| $d_5$ = −478,1880 |
| $R_1$ = −1184,7507 mm. |
| $R_2$ = −372,4513 |
| $R_3$ = −530,4907 |

The system has a magnification of −0.25, a numerical aperture of 0.10 and the circular segment of the image at the area of the plane 5 has an inner radius of 46.1 mm and an outer radius of 46.9 mm so that this plane is scanned with a circular segment-shaped spot having a width of 0.8 mm. The length, or cord, of this spot is of the order of 20–25 mm. The asphericity $E_{asf}$, measured across the entire surface of the mirror, is 85 μm, 35 μm and 4 μm for the mirrors 1, 2 and 3, respectively. The total length, $l_1$ in FIG. 1, measured along the optical axis of the system is approximately 770 mm and the distance between the object point and the image point in the direction perpendicular to the optical axis, $l_2$ in FIG. 1, is approximately 350 mm. The system is intended for image formation by means of radiation having a wavelength of 13 nm, and the mirrors are to this end provided in known manner with a multilayer packet reflecting radiation of this wavelength as satisfactorily as possible.

Figure 2:
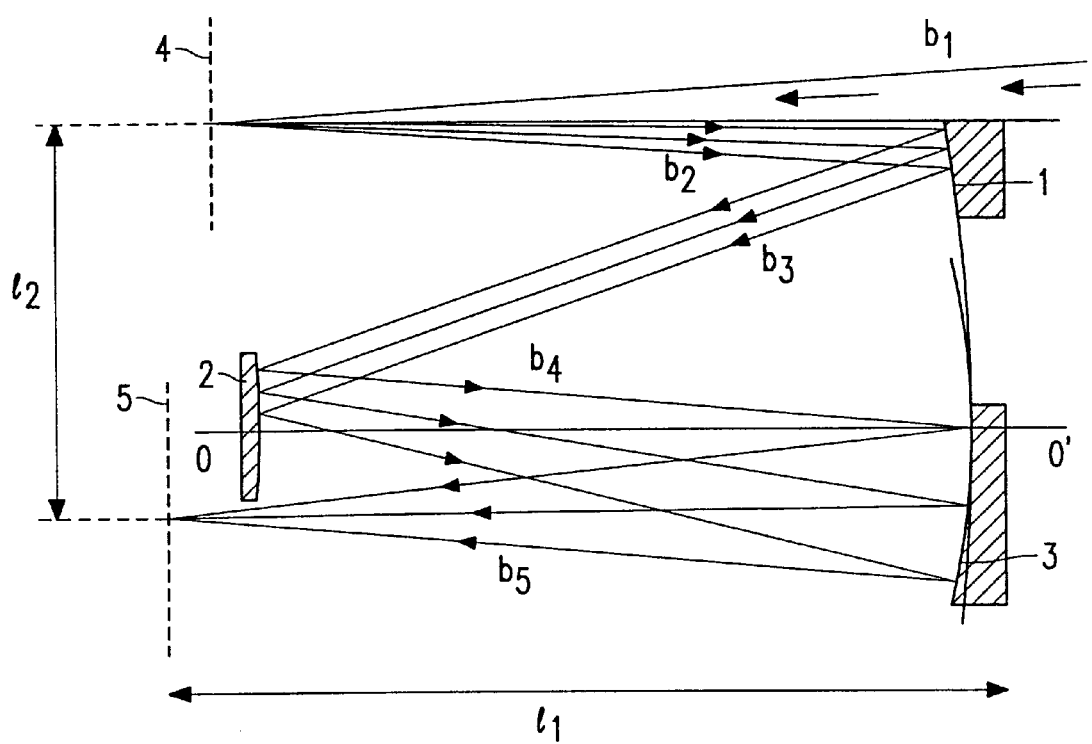
FIG. 2 shows a second embodiment of such a system.

FIG. 2 shows a second design of the projection system according to the invention. This design differs from that in FIG. 1 in that the distance between the convex lens 2 and the image plane 5, the free working distance, is increased, and the angle with respect to the optical axis OO' at which the illumination beam $b_1$ is incident on the object plane 4 is slightly smaller. Furthermore, the system has a length $l_1$ of only 50 cm, i.e. considerably smaller than that of the system of FIG. 1. The dimension $l_2$ is approximately 40 cm i.e. slightly larger than in FIG. 1. The magnification is again −0.25 and the numerical aperture NA is 0.10. The inner radius of the image spot projected in the image plane is now 79.1 mm and the outer radius is 79.9 mm. Table 2 shows the values of the parameters of this system.

TABLE 2

| |
|---|
| $d_1$ = 629,9190 mm |
| $d_2$ = −635,6190 |
| $d_3$ = 240,5290 |
| $d_4$ = 395,7900 |
| $d_5$ = −719,2090 |
| $R_1$ = −1804,2089 mm. |
| $R_2$ = −564,2749 |
| $R_3$ = −796,2392 |

The asphericity, measured across the entire surface of the mirror is 55 μm, 23 μm and 2.5 μm for the mirrors 1, 2 and 3, respectively.

Figure 3:
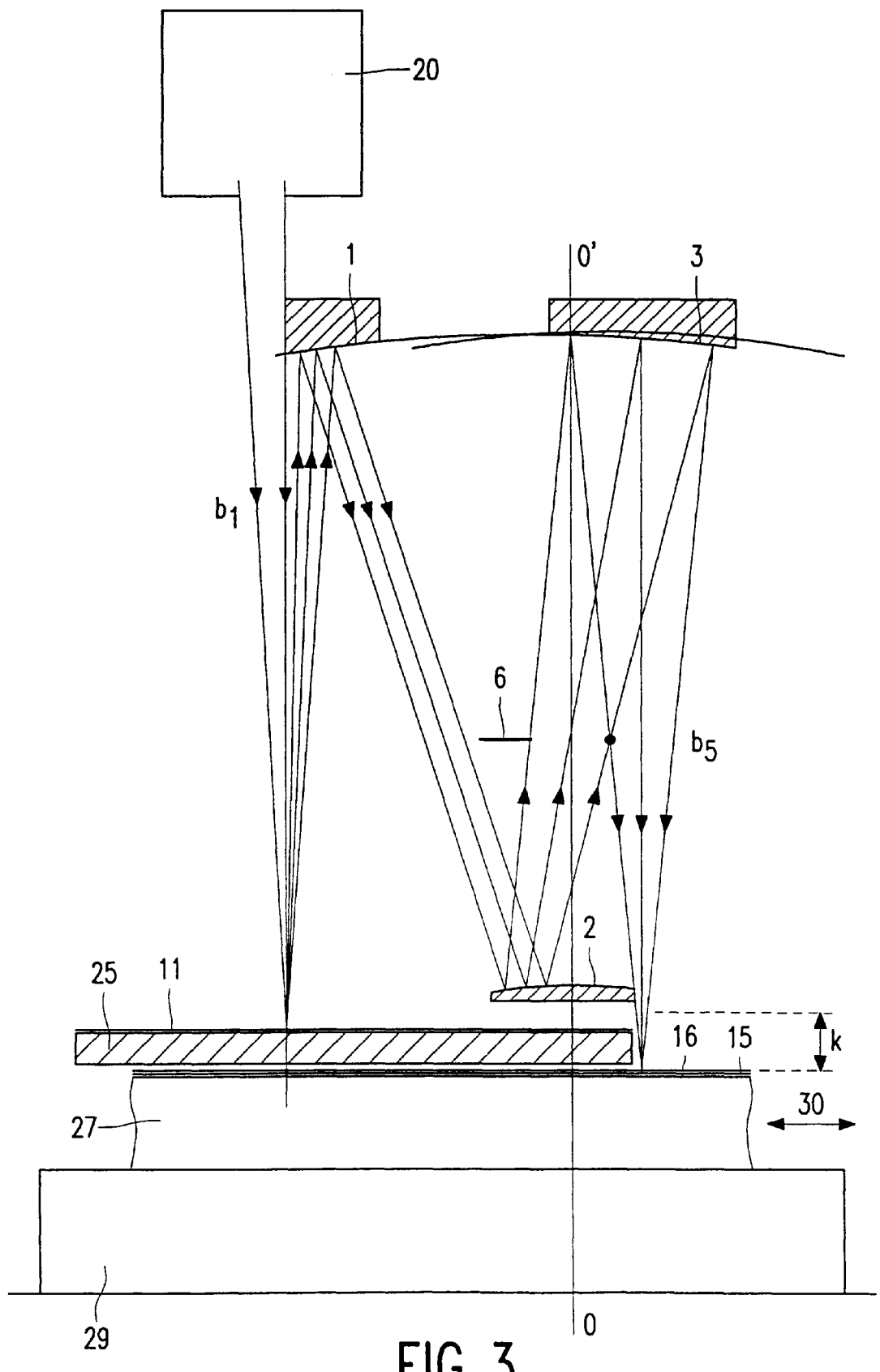
FIG. 3 shows diagrammatically a lithographic projection apparatus comprising such a system.

FIG. 3 shows diagrammatically an embodiment of a step-and-scan lithographic apparatus which comprises a mirror system according to the invention for imaging a mask pattern, present in a mask 11, on a substrate 15 which is provided with a layer 16 sensitive to EUV radiation. The apparatus comprises a diagrammatically shown illumination unit 20 accommodating an EUV radiation source, and an optical system for forming an EUV illumination beam with a cross-section having the shape of a circular segment. The mask, for example a reflecting mask to be imaged is provided on a mask holder which is part of a mask table 25 and by means of which the mask can be moved in the scanning direction 30, and possibly in a direction perpendicular to the scanning direction, such that all areas of the mask pattern can be positioned under the illumination spot formed by the illumination beam $b_1$. The substrate 15 is arranged on a substrate holder 27 which is supported by a substrate stage 29. The stage 29 can move the substrate in the scanning direction (the X direction) but also in the Y direction perpendicular thereto.

Moreover, the substrate can be moved in the Z direction (the direction of the optical axis OO') and rotated about the Z axis. In sophisticated apparatuses, the substrate can also be tilted about the X axis and the Y axis. For further details of a step-and-scan apparatus, reference is made by way of example to PCT patent application WO 97/33204 (PHQ 96.004).

Since the object plane and the image plane are situated at the same side of the projection system, the mask and the substrate can each be positioned in the horizontal plane (XY), so that, under the influence of gravity, both remain flat on their support, which is of great importance in EUV lithographic projection apparatuses.

As is shown in FIG. 3, the mirrors 1 and 3 are situated at substantially the same height. This provides the possibility of jointly mounting the two mirror surfaces in close relationship in a common fitting so that they are well-fixed with respect to each other. Moreover, an unwanted rotation of the mirrors 1 and 3 with respect to the mirror 2, at the area of which the projection system will be rigidly mounted in a frame in practice, then has a negligible effect on the behavior of the projection system.

The apparatus of FIG. 3 comprises a projection system in accordance with FIG. 2, in which the object plane is situated at a relatively large distance from the mirror 2. This provides the possibility of providing the mask table under the mirror 2 close to the path of the object beam $b_5$. It is then not necessary to reserve much more space for the required movement of the mask with respect to the projection system, so that the apparatus can be implemented in a compact form.

In the current embodiments of stepping apparatuses and step-and-scan apparatuses, in which lens systems are used as projection systems, optical sensors are arranged in the space between the substrate and the last lens of the projection system, for example, a height and level sensor described in, for example U.S. Pat. No. 5,191,200 (PHQ 91.007) and/or an image sensor described in, for example U.S. Pat. No. 5,144,363 (PHQ 90.003). If such or other sensors are also to be arranged between the substrate and the mirror 2 in the EUV projection apparatus, the mask table cannot be positioned under the mirror 2. Then, however, the projection system of FIG. 1 can be used. This system is designed in such a way that the distance e between one end of the mirror 2 and the object area V is sufficiently large, for example 200 mm, to enable the mask to perform the scanning movement. In principle, a step-and-scan apparatus comprising the projection system as shown in FIG. 1 has the same structure as that shown in FIG. 3. The differences only reside in the projection system itself and in the horizontal position of the mask table.

The EUV lithographic projection apparatus may be used in the manufacture of ICs, but also, for example, liquid crystalline display panels, integrated, or plenary, optical systems, magnetic heads and guidance and detection patterns for magnetic domain memories.

What is claimed is:

1. A projection system for a step-and-scan lithographic projection apparatus, comprising a source of EUV radiation, in which a mask pattern, present in a mask, is imaged on a substrate provided with a layer which is sensitive to EUV radiation, said projection system having a magnification M of $-\frac{1}{4}$ and a numerical aperture NA of 0.1, and comprising consecutively, from the mask side to the substrate side, a first concave mirror, a convex mirror and a second concave mirror, characterized in that the system has a focal length f of at least $+\frac{1}{2}$ L, in which L is the total length of the system, and the chief ray of the object beam incident on the first concave mirror is inclined towards the optical axis of the system.

2. A projection system as claimed in claim 1, characterized in that the first and the second concave mirror are situated at approximately equal axial positions.

3. A projection system as claimed in claim 1 or 2, characterized in that the axial distance between the object plane of the system and the center of said system is larger than the axial distance between the convex mirror and the center of the system.

4. A projection system as claimed in claim 1 or 2, characterized in that, in the object plane, the distance between the point where the chief ray of the object beam leaves said plane and the convex mirror is at least equal to the dimension of the mask in the direction of said distance.

5. A step-and-scan lithographic projection apparatus comprising a source for EUV radiation, a mask holder for accommodating a mask, a substrate holder for accommodating a substrate, and a three-mirror projection system for imaging a mask pattern, present in the mask, on the substrate, characterized in that the projection system is a system as claimed in claim 1, and the chief ray of the beam emitted by the source and incident on the mask is inclined towards the optical axis of the projection system.

6. An apparatus as claimed in claim 5, characterized in that the axial distance between the upper plane of the substrate holder and the convex mirror is at least equal to the dimension of the mask table plus holder in the axial direction.

7. An apparatus as claimed in claim 5, characterized in that, in the plane of the mask, the distance between the convex mirror and the point where the chief ray of the beam emitted by the source is incident on the mask is at least equal to the dimension of the mask in the direction of said distance.

* * * * *